US011011292B2

(12) United States Patent
Matsuura et al.

(10) Patent No.: US 11,011,292 B2
(45) Date of Patent: May 18, 2021

(54) ELECTRONIC COMPONENT

(71) Applicant: Murata Manufacturing Co., Ltd., Kyoto-fu (JP)

(72) Inventors: Kouhei Matsuura, Nagaokakyo (JP); Morihiro Hamano, Nagaokakyo (JP); Keiichi Tsuduki, Nagaokakyo (JP); Naoyuki Murakami, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 176 days.

(21) Appl. No.: 15/991,857

(22) Filed: May 29, 2018

(65) Prior Publication Data
US 2018/0350499 A1 Dec. 6, 2018

(30) Foreign Application Priority Data

Jun. 2, 2017 (JP) .............................. JP2017-110267

(51) Int. Cl.
*H01F 27/29* (2006.01)
*H01F 17/00* (2006.01)
(Continued)

(52) U.S. Cl.
CPC ..... *H01F 17/0013* (2013.01); *H01F 27/2804* (2013.01); *H01F 27/292* (2013.01);
(Continued)

(58) Field of Classification Search
CPC ............. H01F 17/0013; H01F 17/0006; H01F 2017/0026; H01F 2017/002;
(Continued)

(56) References Cited

U.S. PATENT DOCUMENTS 6,580,350 B1 * 6/2003 Kobayashi .......... H01F 17/0013
336/192
9,245,681 B2 * 1/2016 Kato ................... H01F 17/0013
(Continued)

FOREIGN PATENT DOCUMENTS

CN 102272867 A 12/2011
CN 105590733 A 5/2016
(Continued)

OTHER PUBLICATIONS

An Office Action; "Notification of Reasons for Refusal," issued by the Japanese Patent Office dated Sep. 3, 2019, which corresponds to Japanese Patent Application No. 2017-110267 and is related to U.S. Appl. No. 15/991,857; with English language translation.
(Continued)

*Primary Examiner* — Mang Tin Bik Lian
(74) *Attorney, Agent, or Firm* — Studebaker & Brackett PC

(57) ABSTRACT

An electronic component includes a multilayer body obtained by laminating a plurality of insulator layers the shape of which is substantially rectangular in plan view, a coil conductor in a substantially spiral shape provided on an insulator layer, and a land electrode located outside the coil conductor. The land electrode faces two sides intersecting at a vertex of the substantially rectangular shape when viewed along a direction of laminating the insulator layers, and is electrically connected to an end portion of the coil conductor, in which a shortest distance from one side of the two sides to the land electrode is equal to or longer than a shortest distance from the coil conductor to the one side.

19 Claims, 9 Drawing Sheets

(51) Int. Cl.
  *H01F 27/28* (2006.01)
  *H03H 7/01* (2006.01)
  *H01G 4/232* (2006.01)
  *H01G 4/40* (2006.01)
  *H01G 4/012* (2006.01)

(52) U.S. Cl.
  CPC ............. *H01G 4/012* (2013.01); *H01G 4/232* (2013.01); *H01G 4/40* (2013.01); *H03H 7/0115* (2013.01); *H01F 2017/002* (2013.01); *H01F 2017/0026* (2013.01)

(58) Field of Classification Search
  CPC ............... H01F 27/2804; H01F 27/292; H01F 2027/2809; H03H 7/0115; H01G 4/40; H01G 4/012
  USPC ......................................... 336/200, 223, 182
  See application file for complete search history.

(56) References Cited

U.S. PATENT DOCUMENTS

| | | | | |
|---|---|---|---|---|
| 2004/0233031 | A1* | 11/2004 | Allison | H01F 27/34 336/200 |
| 2005/0122699 | A1* | 6/2005 | Maeda | H01F 17/0013 361/793 |
| 2007/0296536 | A1* | 12/2007 | Odahara | H01F 17/0013 336/200 |
| 2010/0141370 | A1* | 6/2010 | Lu | H01F 27/29 336/200 |
| 2011/0254650 | A1 | 10/2011 | Banno | |
| 2014/0091892 | A1* | 4/2014 | Tominaga | H01F 27/2804 336/200 |
| 2016/0133374 | A1* | 5/2016 | Inui | H01F 27/292 336/192 |
| 2016/0284463 | A1* | 9/2016 | Moriyama | H01F 17/0013 |

FOREIGN PATENT DOCUMENTS

| | | |
|---|---|---|
| CN | 106024327 A | 10/2016 |
| JP | 2004-031591 A | 1/2004 |
| JP | 2013-168466 A | 8/2013 |
| JP | 2016-092267 A | 5/2016 |
| JP | 2016-092322 A | 5/2016 |

OTHER PUBLICATIONS

An Office Action; "Notification of Reasons for Refusal," issued by the Japanese Patent Office dated Feb. 12, 2020, which corresponds to Japanese Patent Application No. 2017-110267 and is related to U.S. Appl. No. 15/991,857; with English language translation.

An Office Action mailed by the China National Intellectual Property Administration dated Jun. 15, 2020, which corresponds to Chinese Patent Application No. 201810531269.0 and is related to U.S. Appl. No. 15/991,857 with English language translation.

* cited by examiner

ELECTRONIC COMPONENT

CROSS-REFERENCE TO RELATED APPLICATION

This application claims benefit of priority to Japanese Patent Application No. 2017-110267, filed Jun. 2, 2017, the entire content of which is incorporated herein by reference.

BACKGROUND

Technical Field

The present disclosure relates to an electronic component including a multilayer body, a coil conductor, and a land electrode.

Background Art

In the related art, as a method for manufacturing an electronic component, a method is known in which a coil conductor and an insulator layer are laminated and the laminated structure is cut into chip-shaped electronic components. According to the method, it is possible to easily manufacture a chip-shaped electronic component having a desired size. For example, Japanese Unexamined Patent Application Publication No. 2013-168466 describes a common mode noise filter having a laminated structure that may be formed by cutting laminated structure. As illustrated in Paragraph 0031 and FIG. 1 of Japanese Unexamined Patent Application Publication No. 2013-168466, in an electronic component of Japanese Unexamined Patent Application Publication No. 2013-168466, a via electrode that fills a via hole is located further outside than an outermost conductor of a substantially spiral conductor. As disclosed in Japanese Unexamined Patent Application Publication No. 2013-168466, a portion of a conductor other than a coil conductor, or an electrode, such as the via electrode (hereinafter, referred to as a "via conductor or the like"), is provided outside the coil conductor.

SUMMARY

However, due to variation in cutting accuracy in a cutting process for manufacturing the electronic component, a problem may occur that only the via electrode or the like located outside the coil conductor is slightly exposed on a cutting-section. Usually, although this exposure defect of the "via conductor or the like" is sorted out by an appearance sorter, there is a problem in the above-described case that a probability of missing the defect in the appearance sorter increases significantly.

The present disclosure aims to provide an electronic component for which exposure of a "via conductor or the like" is easily detected when the "via conductor or the like" is exposed on a cutting-section in a cutting process.

In a preferred embodiment of the present disclosure, an electronic component includes a multilayer body obtained by laminating a plurality of insulator layers a shape of which is substantially rectangular in plan view; a coil conductor in a substantially spiral shape provided between adjacent insulator layers; and at least one land electrode located outside the coil conductor, facing two sides intersecting at a vertex of the substantially rectangular shape when viewed along a direction of laminating the insulator layers, and electrically connected to an end portion of the coil conductor, in which a shortest distance from one side of the two sides to the land electrode is equal to or longer than a shortest distance from the coil conductor to the one side.

In an electronic component according to a preferred embodiment of the present disclosure, a shortest distance from the other side of the two sides to the land electrode is equal to or longer than a shortest distance from the coil conductor to the other side.

In an electronic component according to a preferred embodiment of the present disclosure, the at least one land electrode includes two land electrodes, one of which is located on one surface and the other of which is located on the other surface of at least one insulator layer. The electronic component further includes a via conductor that penetrates the at least one insulator layer and connects the two land electrodes to each other. The via conductor is located outside the coil conductor and facing the two sides when viewed along the direction of laminating the insulator layers, and a shortest distance from the one side to the via conductor is equal to or longer than a shortest distance from the coil conductor to the one side.

In an electronic component according to a preferred embodiment of the present disclosure, a shortest distance from the other side of the two sides to the via conductor is equal to or longer than a shortest distance from the coil conductor to the other side.

In an electronic component according to a preferred embodiment of the present disclosure, an area of a surface of the land electrode facing the via conductor is smaller than an area of a surface of the via conductor facing the land electrode, and the land electrode is located inside the surface of the via conductor facing the land electrode when viewed along the direction of laminating the insulator layers.

In an electronic component according to a preferred embodiment of the present disclosure, a shortest interval between the via conductor and the coil conductor is longer than a spiral interval of the coil conductor.

In an electronic component according to a preferred embodiment of the present disclosure, a shortest interval between the coil conductor and the land electrode is longer than the spiral interval of the coil conductor.

In an electronic component according to a preferred embodiment of the present disclosure, a connection width of a portion at which the coil conductor and the land electrode are connected is wider than a width of a portion of the coil conductor, the portion forming a substantially spiral shape of the coil conductor.

In an electronic component according to a preferred embodiment of the present disclosure, the plurality of insulator layers are substantially rectangular shapes each having a long side and a short side, and the coil conductor includes a linear portion parallel to at least one of the long side and the short side.

In an electronic component according to a preferred embodiment of the present disclosure, the plurality of insulator layers are substantially rectangular shapes each having a long side and a short side, and a portion of the coil conductor facing a short side of the multilayer body has a substantially semicircular shape.

In an electronic component according to a preferred embodiment of the present disclosure, the coil conductor includes coil conductors to form a primary coil and coil conductors to form a secondary coil. The multilayer body includes eight insulator layers, and the coil conductor and the land electrode are provided on the insulator layers in the following manner. That is, the coil conductors that form the primary coil are provided on first, third, fourth, and seventh laminated layers among the eight insulator layers, and the coil conductors that form the secondary coil are provided on second, fifth, sixth, and eighth laminated layers among the eight insulator layers. A respective land electrode is provided on each of the first through eighth laminated layers.

In an electronic component according to a preferred embodiment of the present disclosure, the coil conductor includes coil conductors to form a primary coil and coil conductors to form a secondary coil. The multilayer body includes eight insulator layers, and the coil conductor and the land electrode are provided on the insulator layers in the following manner. That is, the coil conductors that form the primary coil are provided on first, third, fifth, and seventh laminated layers among the eight insulator layers, and the coil conductors that form the secondary coil are provided on second, fourth, sixth, and eighth laminated layers among the eight insulator layers. A respective land electrode is provided on each of the first through eighth laminated layers.

In an electronic component according to a preferred embodiment of the present disclosure, the coil conductor includes coil conductors to form a primary coil and coil conductors to form a secondary coil. The multilayer body includes eight insulator layers, and the coil conductor and the land electrode are provided on the insulator layers in the following manner. That is, the coil conductors the form the primary coil are provided on first, fourth, fifth, and eighth laminated layers among the eight insulator layers, and the coil conductors that form the secondary coil are provided on second, third, sixth, and seventh laminated layers among the eight insulator layers. A respective land electrode is provided on each of the first through eighth laminated layers.

In an electronic component according to a preferred embodiment of the present disclosure, the at least one land electrode includes two land electrodes, one of which is provided at a corner and the other of which is provided at another corner diagonally of the substantially rectangular shape.

According to the present disclosure, provided is an electronic component with a configuration being not likely to cause only a land electrode exposing on a cutting-section in a cutting process. Thus, a defect piece is not likely to pass through an appearance sorter.

Other features, elements, characteristics and advantages of the present disclosure will become more apparent from the following detailed description of preferred embodiments of the present disclosure with reference to the attached drawings.

DETAILED DESCRIPTION

The inventors noticed, when checking a situation in which a defect piece on whose cutting-section an electrode is exposed by a cutting process passes an appearance sorter, that a cause of the situation is that an area of a land electrode exposed on the cutting-section is too small. Accordingly, an electronic component of the present embodiment has such a configuration that in a case where a land electrode is exposed on an cutting-section by a cutting process, a coil conductor is always exposed as well, and in a case where a tiny area of the land electrode is exposed on the cutting-section, a relatively large area of the coil conductor is always exposed on the cutting-section so that appearance sorting of a defect piece is easily facilitated. Hereinafter, electronic components according to embodiments of the present disclosure will be described in detail with reference to the drawings.

Figure 1:
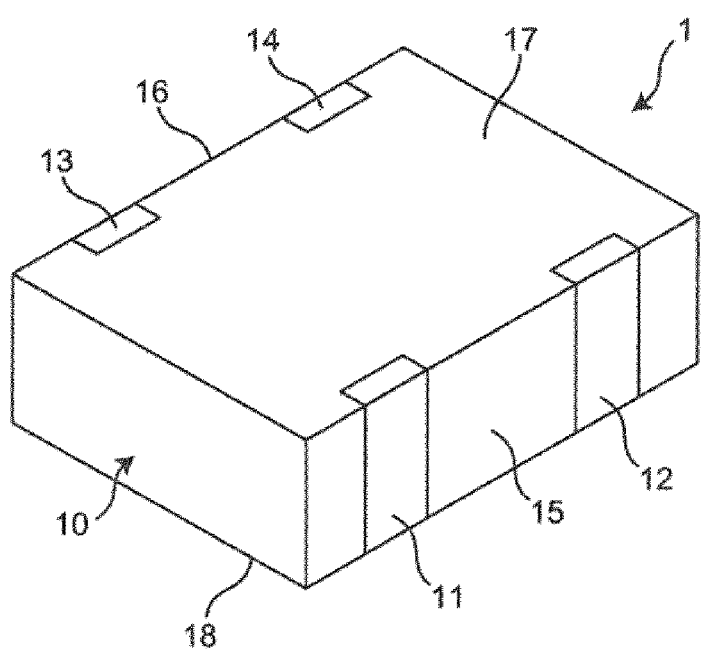
FIG. 1 is a perspective view of an electronic component according to a first embodiment of the present disclosure.
Figure 2:
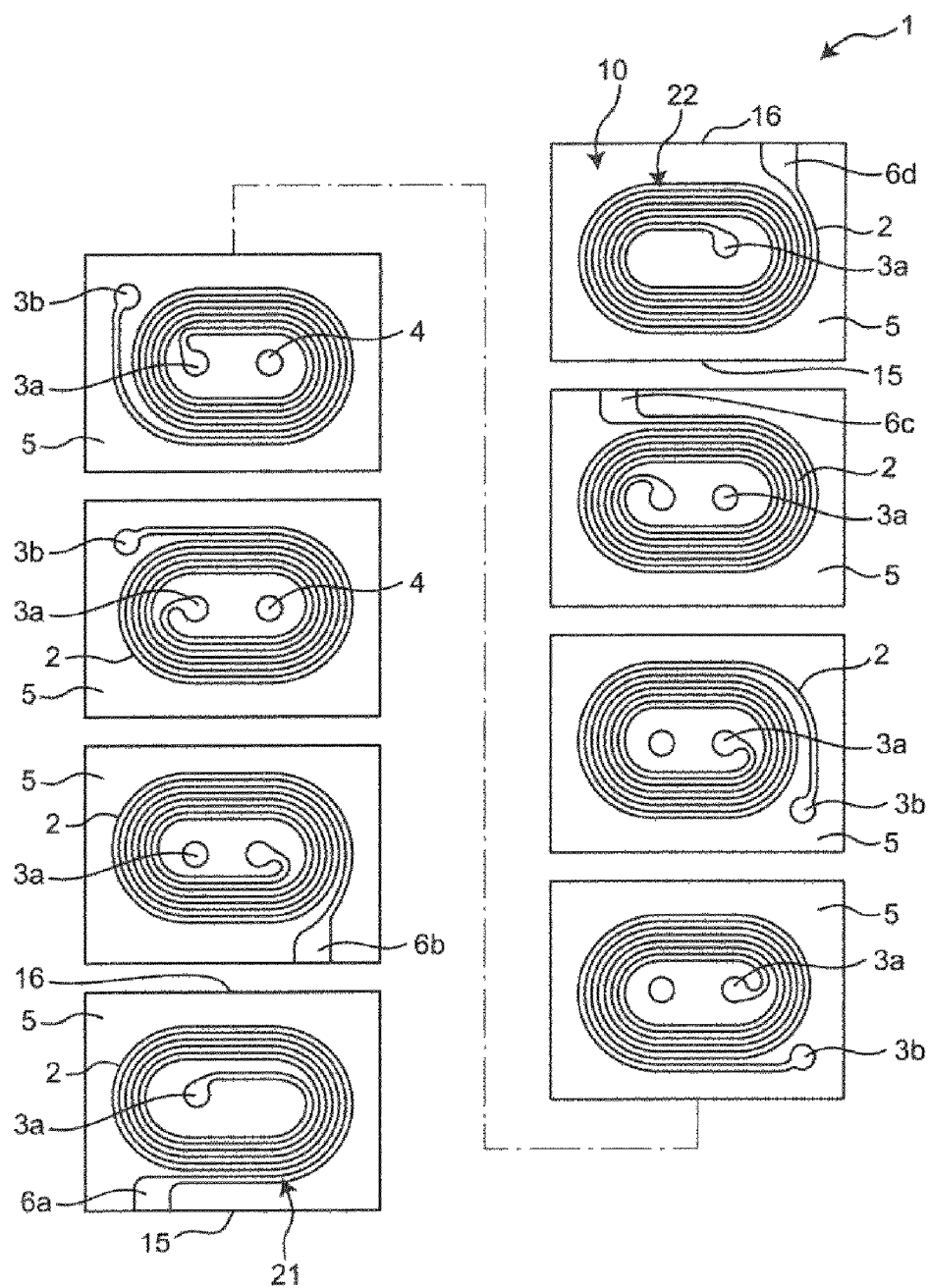
FIG. 2 is an exploded plan view of the electronic component according to the first embodiment of the present disclosure.

FIG. 1 is a perspective view of an electronic component 1 according to a first embodiment of the present disclosure, and FIG. 2 is an exploded plan view of the electronic component 1 according to the first embodiment of the present disclosure. As illustrated in FIG. 1 and FIG. 2, the electronic component 1 includes a multilayer body 10, a first electrode 11 to a fourth electrode 14, a primary coil 21, and a secondary coil 22. The multilayer body 10 of the electronic component 1 has a substantially rectangular parallelepiped shape, and includes a top face 17, a bottom face 18, and a first side surface 15 and a second side surface 16 facing each other. The first electrode 11 and the second electrode 12 are provided on the first side surface 15, and the third electrode 13 and the fourth electrode 14 are provided on the second side surface 16. The primary coil 21 is embedded inside the multilayer body 10 in a state that one end portion of the primary coil 21 is connected to the first electrode 11 and the other end portion of the primary coil 21 is connected to the third electrode 13. The secondary coil 22 is embedded inside the multilayer body 10 in a state that one end portion of the secondary coil 22 is connected to the second electrode 12 and the other end portion of the secondary coil 22 is connected to the fourth electrode 14.

As illustrated in FIG. 2, the multilayer body 10 of the electronic component 1 in FIG. 1 is obtained by laminating a plurality of insulator layers 5 the shape of which is substantially rectangular in plan view. In the specification, a "substantially rectangular shape" includes a quadrangular shape having corners of substantially 90 degrees, and a quadrangular shape having substantially round corners. In the first embodiment, the multilayer body 10 includes eight insulator layers 5 adjacent to each other. A substantially spiral coil conductor 2 is provided between the adjacent insulator layers 5. Although not illustrated in FIG. 2, the multilayer body 10 may further include an insulator layer 5 on which the coil conductor 2 is not provided between the insulator layer 5 and an adjacent insulator layer 5. Among the eight insulator layers 5 illustrated in FIG. 2, a bottom layer on the left side is laminated first, and the remaining three layers on the left side are laminated in order. Next, a bottom layer on the right side is laminated fifth, and the remaining three layers on the right side are laminated in order.

In the specification, it is sufficient that an "insulator layer" is formed of a material having an electrically insulating property. The insulator layer includes, for example, a layer being a magnetic body and a layer being a non-magnetic body. The insulator layer 5 may be formed of any materials, and, for example, may include a material containing glass, or glass and ferrite as main components. Since the insulator layer 5 of the electronic component 1 according to the present disclosure includes the above-described components as the main components, it is possible to form the insulator layer 5 with a material having a low permittivity. This makes it possible to reduce stray capacitance that occurs between the primary coil and the secondary coil formed using combinations of the coil conductors 2, and to improve electrical characteristics of the electronic component 1 at a high frequency. Here, the electrical characteristics refer to, for example, impedance characteristics, a cutoff frequency in differential transmission, or the like. In the specification, "glass" means a material containing silicon dioxide ($SiO_2$) as a component having a maximum mass ratio, and refers to, for example, alkali borosilicate glass, or the like. In the specification, a "main component" of the insulator layer 5 means a component that is contained in such a way that a percentage by mass of the component is at least 50 with respect to the whole mass of the insulator layer 5. Although the insulator layer 5 illustrated in FIG. 2 has a substantially rectangular shape with a long side and a short side, the insulator layer 5 in the electronic component according to the present disclosure may have a substantially rectangular shape with lengths of four sides being the same (square shape).

The first electrode 11 and the second electrode 12 are provided on the first side surface 15, are bent to make end portions thereof contact with the top face 17 and the bottom face 18, respectively, and thus are substantially U-shaped. The third electrode 13 is provided on the second side surface 16 so as to face the first electrode 11, is bent to make end portions thereof contact with the top face 17 and the bottom face 18, respectively, and thus is substantially U-shaped. The fourth electrode 14 is provided on the second side surface 16 so as to face the second electrode 12, is bent to make end portions thereof contact with the top face 17 and the bottom face 18, respectively, and thus is substantially U-shaped.

As illustrated in FIG. 2, at least one land electrode is provided on the insulator layer 5. In the first embodiment, of both end portions of the substantially spiral coil conductors 2 provided on the third to sixth insulator layers 5 laminated, one end portion is connected to a land electrode 3a and the other end portion is connected to a land electrode 3b. In the specification, the "land electrode 3a" is a land electrode located inside the substantially spiral coil conductor 2, and the "land electrode 3b" is a land electrode located outside the substantially spiral coil conductor 2. The electronic component 1 does not include the land electrode 3b that is not connected to an end portion of a coil conductor, but the second to seventh insulator layers 5 laminated, respectively, include the land electrodes 3a that is not connected to an end portion of a coil conductor. The land electrode 3a that is not connected to an end portion of a coil conductor is provided at the same location as the land electrode 3a provided on an adjacent insulator layer 5. One end portion of the substantially spiral coil conductors 2, provided on the first, second, seventh, and eighth insulator layers 5 laminated among the insulator layers 5 illustrated in FIG. 2, is connected to the land electrode 3a, and the other end portion is connected to corresponding one of lead-out conductors 6a through 6d.

In the first embodiment, coil conductors include coil conductors forming the primary coil 21 and coil conductors forming the secondary coil 22. Among the eight coil conductors 2 provided on the insulator layers 5, the coil conductors 2 provided on the first, the third, the fourth, and the seventh laminated insulator layers 5, respectively, are connected to each other with the land electrodes 3a and 3b and via conductors 4 penetrating the insulator layers 5, and form the primary coil 21 having the lead-out conductors 6a and 6c on both end portions thereof, respectively. Among the eight coil conductors 2 provided on the insulator layers 5, the coil conductors 2 provided on the second, the fifth, the sixth, and the eighth laminated insulator layers 5, respectively, are connected to each other with the land electrodes 3a and 3b and the via conductors 4 penetrating the insulator layers 5, and form the secondary coil 22 having the lead-out conductors 6b and 6d on both end portions thereof, respectively. As described above, it is possible to configure the electronic component 1 as various electronic components such as a common mode choke coil, an inductor element, an LC composite component, or the like, by connecting the coil conductors 2 provided on respective layers.

In the first embodiment, the lead-out conductor 6a for the coil conductor 2 provided on the first insulator layer 5 laminated is electrically connected to the first electrode 11 of the electronic component 1. The lead-out conductor 6c provided on the seventh insulator layer 5 laminated is electrically connected to the third electrode 13 of the electronic component 1. This makes it possible to apply a voltage to the primary coil 21 by applying a voltage between the first electrode 11 and the third electrode 13. The lead-out conductor 6b provided on the second insulator layer laminated is electrically connected to the second electrode 12 of the electronic component 1. The lead-out conductor 6d provided on the eighth insulator layer laminated is electrically connected to the fourth electrode 14 of the electronic component 1. This makes it possible to apply a voltage to the secondary coil 22 by applying a voltage between the second electrode 12 and the fourth electrode 14.

As described above, in FIG. 2, the coil conductors 2 provided on the first, the third, the fourth, and the seventh insulator layers 5 laminated form the primary coil 21, and the coil conductors 2 provided on the second, the fifth, the sixth, and the eighth insulator layers 5 laminated form the secondary coil 22, however, an embodiment of the present disclosure is not limited thereto, and it is possible to form the primary coil 21 and the secondary coil 22 using any combinations of the coil conductors 2. For example, the coil conductors 2 provided on the first, the third, the fifth, and the seventh insulator layers 5 laminated may form the primary coil 21, and the coil conductors 2 provided on the second, the fourth, the sixth, and the eighth insulator layers 5 laminated may form the secondary coil 22. Further, the coil conductors 2 provided on the first, the fourth, the fifth, and the eighth insulator layers 5 laminated may form the primary coil 21, and the coil conductors 2 provided on the second, the third, the sixth, and the seventh insulator layers 5 laminated may form the secondary coil 22.

Figure 3:
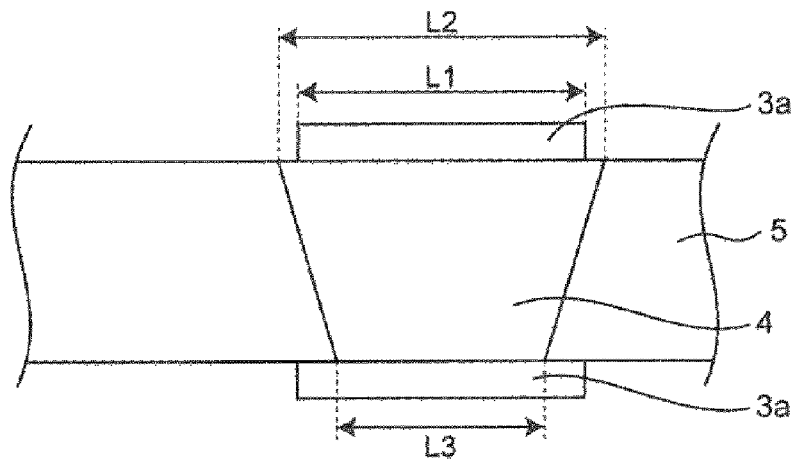
FIG. 3 is a partially sectional view of an insulator layer of the electronic component in FIG. 1.

FIG. 3 is a cross-sectional view, when laminated, of a portion of the fifth insulator layer laminated of the electronic component 1 illustrated in FIG. 2. The portion includes the land electrode 3a that is not connected to the coil conductor 2. The via conductor 4 penetrating the insulator layer 5 is provided under the land electrode 3a on the fifth insulator layer laminated. In addition, the land electrode 3a on the fourth insulator layer laminated is located under the via conductor 4, thus the land electrode 3a on the fifth insulator layer laminated is electrically connected to the land electrode 3a on the fourth insulator layer laminated. Although only the portion of the fifth insulator layer laminated of the electronic component 1 that includes the land electrode 3a which is not connected to the coil conductor 2 is illustrated in FIG. 3, in the first embodiment, the land electrodes 3a provided at the same location on adjacent insulator layers 5 are connected to each other with the via conductor 4 provided in a through-hole, as illustrated in FIG. 3. Meanwhile, in the first embodiment, the land electrodes 3b provided on the same location on the adjacent insulator layers 5 are connected to each other with the via conductor 4 provided in a through-hole, as illustrated in FIG. 3.

In a cross-section of FIG. 3, a width L1 of a surface, of a cross-section of the land electrode 3a on the fifth insulator layer laminated, facing the via conductor 4 is smaller than a width L2 of a surface, facing the land electrode 3a on the fifth insulator layer laminated, of the via conductor 4, and L1 is illustrated inside both end portions of L2. This is because an area of a surface, facing the via conductor 4, of the land electrode 3a on the fifth insulator layer laminated, is smaller than an area of a surface, facing the land electrode 3a on the fifth insulator layer laminated, of the via conductor 4, and the land electrode 3a is located inside a surface of the via conductor 4 facing the land electrode 3a, when viewed along the direction of laminating the insulator layers. This makes it possible to make the whole surface of the land electrode 3a facing the via conductor 4 contact with the via conductor 4, and thus improve connection reliability of the land electrode 3a. Similarly, in a case where an area of a surface, facing the via conductor 4, of the land electrode 3b is smaller than an area of a surface, facing the land electrode 3b, of the via conductor 4, and the land electrode 3b is located inside the surface, facing the land electrode 3b, of the via conductor 4, when viewed along the direction of laminating the insulator layers, the whole surface, facing the via conductor 4, of the land electrode 3b contacts with the via conductor 4 and thus it is possible to improve connection reliability of the land electrode 3b.

In a cross-section in FIG. 3, a width L3 of a surface, facing the land electrode 3a on the fourth insulator layer laminated, of the via conductor 4 is smaller than the width L2 of the surface facing the land electrode 3a on the fifth insulator layer laminated, of the via conductor 4. This is because the through-hole portion that the via conductor 4 fills has a substantially frustum shape in which an opening on a surface on a lower side in the direction of laminating the insulator layers 5 is smaller than an opening on a surface on an upper side in the direction of laminating the insulator layers 5. It is possible to form the through-hole having this shape by irradiating the insulator layer 5 with a laser from the upper side in the direction of laminating the insulator layers 5. The through-hole may be formed by irradiating the insulator layer 5 with a laser from the lower side in the direction of laminating the insulator layers 5, and may be tapered in a reverse direction compared with a direction in FIG. 3. Further, by forming with another appropriate method, the through-hole may have a substantially pillar shape in which a size of an opening of the surface on the upper side in the direction of laminating the insulator layers 5 and a size of an opening of the surface on the lower side in the direction of laminating the insulator layers 5 are substantially the same. Although only the through-hole portion filled with a via conductor electrically connected to the land electrode 3a is illustrated in FIG. 3, a through-hole portion filled with a via conductor electrically connected to the land electrode 3b may be formed so as to have a similar shape with a similar method.

Figure 4:
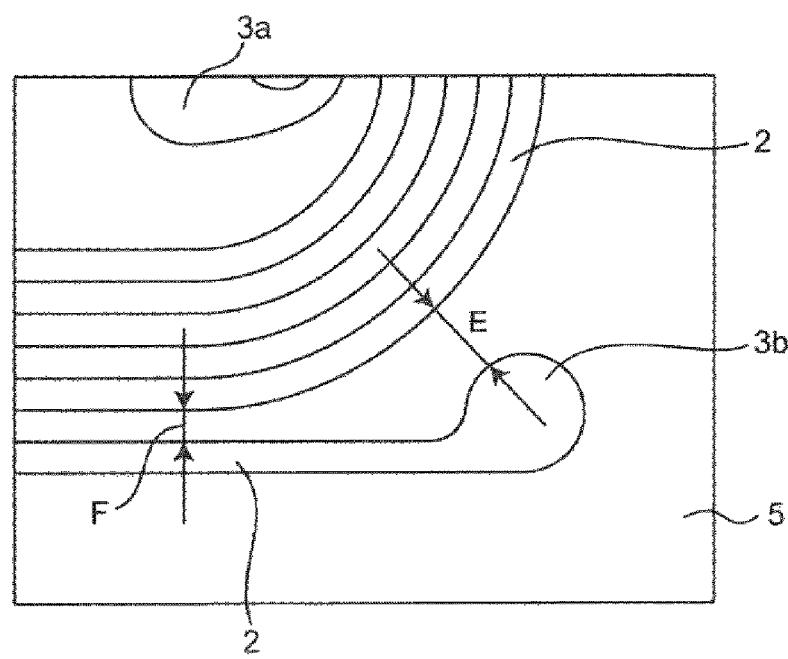
FIG. 4 is a partially enlarged view of the insulator layer of the electronic component in FIG. 1.

FIG. 4 is an enlarged view of a portion, of the fifth insulator layer 5 laminated of the electronic component 1 illustrated in FIG. 2, that includes the land electrode 3b. As illustrated in FIG. 4, a shortest interval E between the coil conductor 2 and the land electrode 3b is preferably longer than a spiral interval F of the coil conductor 2. Note that, the shortest interval E between the coil conductor 2 and the land electrode 3b is a distance between the land electrode 3b and a portion, being on the same plane as the land electrode 3b and facing the land electrode 3b, of the coil conductor 2. The spiral interval F of the coil conductor 2 refers to a distance, as illustrated in FIG. 4, from a portion of the coil conductor 2 forming a substantially spiral shape to an adjacent portion of the coil conductor 2 on an outer circumferential side. Since the electronic component 1 has such configuration, an enough distance is present between the land electrode 3b and the facing coil conductor 2. This makes it possible to prevent short circuit with the coil conductor 2 and improve reliability of the electronic component 1. Although only the portion, including the land electrode 3b, of the fifth insulator layer 5 laminated of the electronic component 1 is illustrated in FIG. 4, in the electronic component 1 according to an embodiment of the present disclosure, similar relation is preferably established between shortest distances from any of the land electrodes 3b to the coil conductor 2 and the spiral interval of the coil conductor 2.

In addition, a shortest interval between the via conductor 4 located outside outermost circumference of the coil conductor 2 and connecting the land electrodes 3b and the coil conductor 2 being on the same plane as the via conductor 4, is preferably longer than the above-described spiral interval F, as in the case of the above-described shortest interval E. Since the electronic component 1 according to the present disclosure has such configuration, an enough distance is present between the coil conductor 2 and the via conductor 4. This makes it possible to prevent short circuit with the coil conductor 2 and improve reliability of the electronic component 1.

Figure 5:
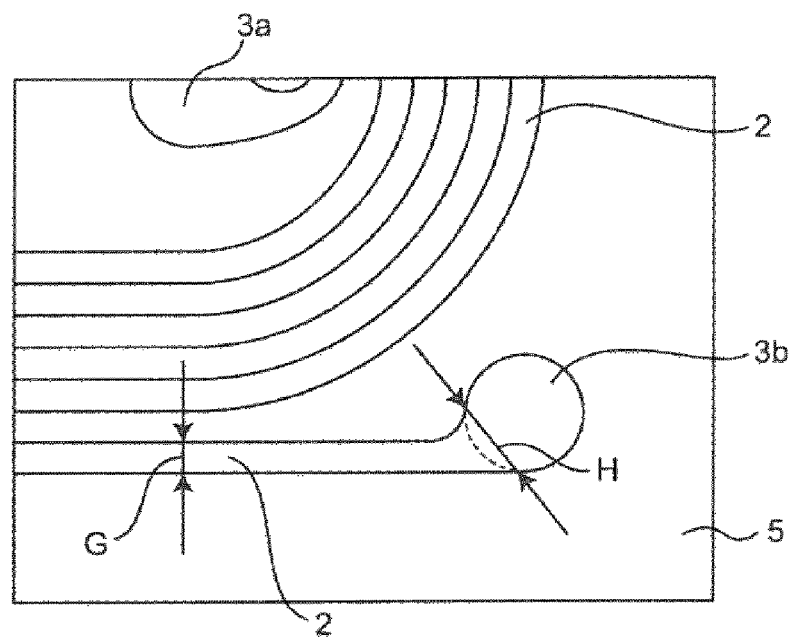
FIG. 5 is a partially enlarged view of the insulator layer of the electronic component in FIG. 1.

FIG. 5 is an enlarged view of a portion, of the fifth insulator layer 5 laminated of the electronic component 1 illustrated in FIG. 2, that includes the land electrode 3b. As illustrated in FIG. 5, a connection width H of a portion at which the coil conductor 2 and the land electrode 3b are connected is preferably wider than a width G of a portion of the coil conductor 2 forming the substantially spiral shape of the coil conductor 2. Since the electronic component 1 has such configuration, it is possible to reduce a possibility that a disconnection defect occurs in the portion at which the coil conductor 2 and the land electrode 3b are connected, and improve connection reliability between the coil conductor 2 and the land electrode 3b. Although only the portion, including the land electrode 3b, of the fifth insulator layer 5 laminated of the electronic component 1 is illustrated in FIG. 5, in the electronic component 1 according to the present disclosure, any one of the land electrodes 3a and 3b may have a similar connection width.

As illustrated in the partially enlarged views in FIGS. 4 and 5, in the first embodiment, the land electrode 3b has a substantially circular shape. In the present disclosure, since each of the land electrodes 3a and 3b has a substantially circular shape, it is easy to make the shortest interval E between the land electrode 3a or 3b and the portion, facing the land electrode 3a or 3b, of the coil conductor 2 being on the same plane as the land electrodes 3a and 3b longer, in comparison with a case that, for example, a land electrode has a substantially rectangular shape. This allows an enough distance to be present from the coil conductor 2 to the land electrode 3a or 3b, thus makes it possible to prevent short circuit with the coil conductor 2 and improve reliability of the electronic component 1.

Figure 6:
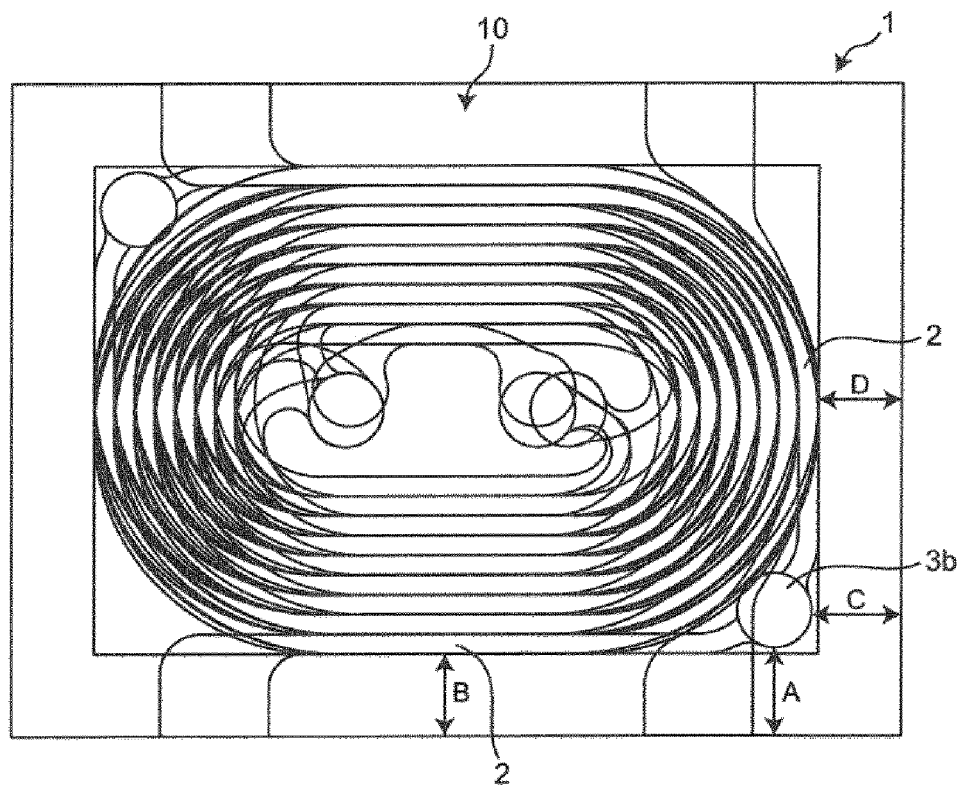
FIG. 6 is a perspective top view of the electronic component in FIG. 1.

FIG. 6 is a perspective top view of the electronic component 1 in FIG. 2, viewed along the direction of laminating the insulator layers in the multilayer body 10. The land electrode 3b is located outside the coil conductor 2 and faces two sides intersecting at a vertex of the substantially rectangular shape, and is electrically connected to an end portion of the coil conductor 2. In the specification, "facing a side" means facing a side of the multilayer body 10 without the coil conductor 2 interposed therebetween.

In FIG. 6, a shortest distance A from the land electrode 3b to a long side of the multilayer body 10 is longer than a shortest distance B from the coil conductor 2 to the long side of the multilayer body 10. Here, the shortest distance A from the land electrode 3b to the long side of the multilayer body 10 is the shortest distance among distances from a plurality of the land electrodes 3b included in the electronic component to the long side of the multilayer body 10, when viewed along the direction of laminating the insulator layers in the multilayer body 10. Further, the shortest distance B from the coil conductor 2 to the long side of the multilayer body 10 is the shortest distance among distances from a plurality of the coil conductors 2 included in the electronic component to the long side of the multilayer body 10, when viewed along the direction of laminating the insulator layers in the multilayer body 10. The electronic component 1 according to the present disclosure illustrated in FIG. 6 has such configuration, thus in a process in which the multilayer body 10 is cut parallel to a long side direction thereof, in a case where the land electrode 3b is exposed on a cutting-section, the coil conductor 2 is always exposed as well. Accordingly, the land electrode 3b and the coil conductor 2 are exposed with enough sizes that may not be missed by an appearance sorter in a defect piece on which the land electrode 3b is exposed due to variation in cutting accuracy, and thus it is possible to prevent the defect piece from passing the appearance sorter.

In FIG. 6, a shortest distance C from the land electrode 3b to a short side of the multilayer body 10 is longer than a shortest distance D from the coil conductor 2 to the short side of the multilayer body 10. Here, the shortest distance C from the land electrode 3b to the short side of the multilayer body 10 is the shortest distance among distances from the plurality of the land electrodes 3b included in the electronic component to the short side of the multilayer body 10, when viewed along the direction of laminating the insulator layers in the multilayer body 10. Further, the shortest distance D from the coil conductor 2 to the short side of the multilayer body 10 is the shortest distance among distances from the plurality of the coil conductors 2 included in the electronic component to the short side of the multilayer body 10, when viewed along the direction of laminating the insulator layers in the multilayer body 10. The electronic component 1 according to the present disclosure illustrated in FIG. 6 has such configuration, and thus in a process in which the multilayer body 10 is cut parallel to a short side direction thereof, in a case where the land electrode 3b is exposed on a cutting-section, the coil conductor 2 is always exposed as well. Accordingly, the land electrode 3b and the coil conductor 2 are exposed with enough sizes that may not be missed by an appearance sorter in a defect piece on which the land electrode 3b is exposed due to variation in cutting accuracy, and thus it is possible to prevent the defect piece from passing the appearance sorter.

In FIG. 6, the shortest distance A from the land electrode 3b to the long side of the multilayer body 10 is longer than the shortest distance B from the coil conductor 2 to the long side of the multilayer body 10, and the shortest distance C from the land electrode 3b to the short side of the multilayer body 10 is longer than the shortest distance D from the coil conductor 2 to the short side of the multilayer body 10. However, in the electronic component according to the present disclosure, in a case where a shortest distance from one side of the two sides, that is, the long side and the short side, to the land electrode 3b is equal to or longer than a shortest distance from the coil conductor 2 to the one side, and where the land electrode 3b is exposed on a cutting-section in a cutting process parallel to the one side, the coil conductor 2 is always exposed as well. Accordingly, the land electrode 3b and the coil conductor 2 are exposed with enough sizes that may not be missed by the appearance sorter, in a defect piece on which the land electrode 3b is exposed due to variation in accuracy of the cutting parallel to the one side, and thus it is possible to prevent the defect piece from passing the appearance sorter.

The electronic component 1 includes, as illustrated in FIG. 3, the two land electrodes 3b located on both sides of the one insulator layer, respectively, and the via conductor 4 that is provided to penetrate the one insulator layer and connects the two land electrodes 3b. That is, in the first embodiment, the via conductor 4 connecting the land electrodes 3b is located outside the coil conductor 2 and faces two sides of the insulator layer, when viewed along the direction of laminating the insulator layers in the multilayer body 10. Here, a shortest distance from the via conductor 4 connecting the land electrodes 3b to the long side of the multilayer body 10 is preferably equal to or longer than the above-described shortest distance B, as in the above-described case of the shortest distance A. Further, a shortest distance from the via conductor 4 connecting the land electrodes 3b to the short side of the multilayer body 10 is preferably equal to or longer than the above-described shortest distance D, as in the above-described case of the shortest distance C. That is, a shortest distance from one side to a via conductor 4 is preferably equal to or longer than a shortest distance from a coil conductor to the one side. With such configuration, in a case where the via conductor 4 is exposed on a cutting-section, the coil conductor 2 is always exposed as well, in at least one of a cutting process parallel to the short side direction of the insulator layer 5 and a cutting process parallel to the long side direction. Accordingly, a defect piece that is manufactured with the via conductor 4 exposed due to variation in cutting accuracy, has an exposed portion of the coil conductor 2 with enough size that may not be missed by the appearance sorter, and thus it is possible to prevent the defect piece from passing the appearance sorter.

The electronic component 1 in FIG. 6 includes the land electrodes 3b one of which is provided at one corner and the other of which is provided at the other corner diagonally of a substantially rectangular shape. This is because, among the eight insulator layers 5 illustrated in FIG. 2, in the third and the fifth insulator layers 5 laminated, and the fourth and the sixth insulator layers 5 laminated, respectively, the land electrodes 3b are located at one corner and at the other corner diagonally of a substantially rectangular shape. Thus, in the first embodiment, the third and the fifth insulator layers 5 laminated, and the fourth and the sixth insulator layers 5 laminated are point-symmetric each other, respectively. Accordingly, in the electronic component 1 in FIG. 2, an insulating layer forming the multilayer body 10 may be manufactured from six types of insulator layers 5, thus the manufacturing is easier compared with an electronic component not including the land electrodes 3b provided at one corner and at the other corner diagonally of a substantially rectangular shape.

In the electronic component 1 in FIG. 6, the insulator layer has a substantially rectangular shape having a long side and a short side, and the coil conductor 2 includes a linear portion parallel to the long side of the multilayer body 10. As described above, since the coil conductor 2 includes at least one of the linear portion parallel to the long side of the multilayer body 10 and a linear portion parallel to the short side of the multilayer body 10, in a case where a surface of the coil conductor 2 is exposed, in at least one of a cutting process parallel to the short side direction of the insulator layer 5 and a cutting process parallel to the long side direction, the exposed surface is likely to have an enough exposure area to be evaluated as a defect by the appearance sorter.

In the electronic component 1 in FIG. 6, the insulator layer has the substantially rectangular shape having the long side and the short side, and the portion of the coil conductor facing the short side of the multilayer body 10 has the substantially semicircular shape. Since the electronic component 1 according to the present disclosure has such configuration, it is possible to increase inductance efficiently, and to configure various higher performance electronic components such as a common mode choke coil, inductor element, LC composite component, or the like.

Hereinafter, FIGS. 7 to 10 illustrating another embodiment according to the present disclosure are described. Among respective portions illustrated in FIGS. 7 to 10, a portion assigned the same reference numeral as a portion of the first embodiment has the same characteristics as those of the portion of the first embodiment.

Figure 7:
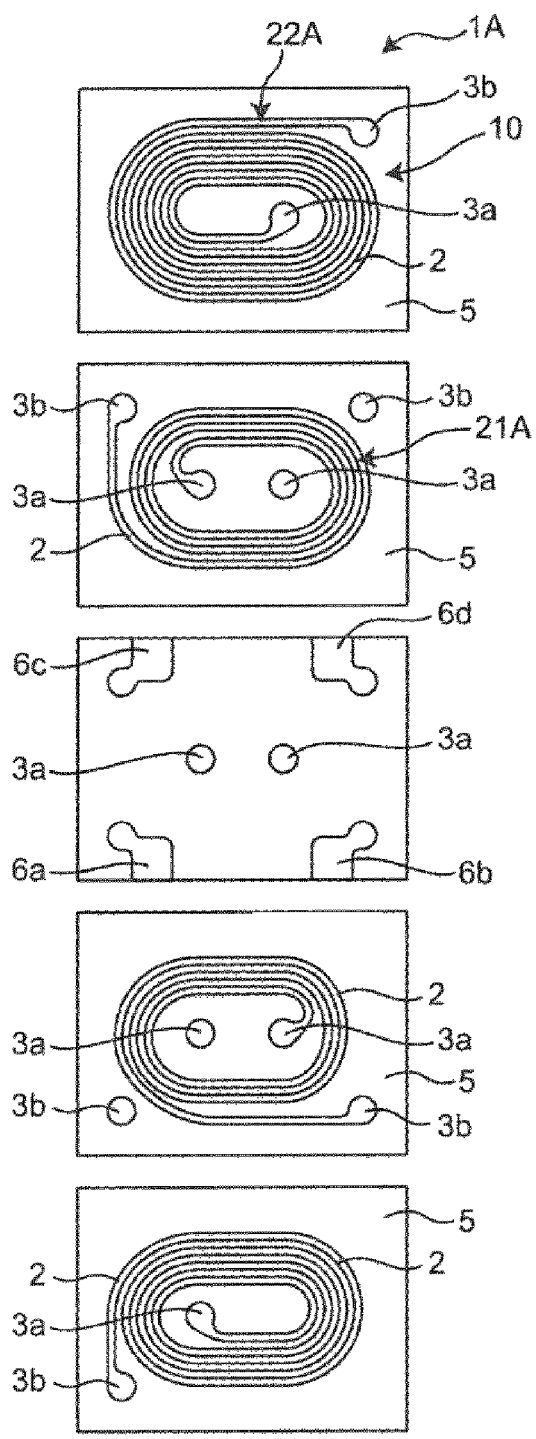
FIG. 7 is an exploded plan view of a multilayer body of an electronic component according to a second embodiment of the present disclosure.

FIG. 7 is an exploded plan view of an electronic component 1A according to a second embodiment of the present disclosure. The multilayer body 10 of the electronic component 1A in FIG. 7 includes, at least five insulator layers, and includes, in addition to the insulator layer 5 on which a lead-out conductor is not provided, the insulator layer 5 on which the lead-out conductor is provided but the coil conductor 2 is not provided. In the second embodiment, a primary coil 21A and a secondary coil 22A are formed by connecting the two coil conductors 2, respectively. The five insulator layers 5 illustrated in FIG. 7 are laminated in order from a bottom.

Of both end portions of the substantially spiral coil conductors 2 provided on the first, second, fourth, and fifth insulator layers 5 laminated among the insulator layers 5 in FIG. 7, one end portion is connected to the land electrode 3a and the other end portion is connected to the land electrode 3b. The second and the fourth insulator layers 5 laminated further include the land electrodes 3a and 3b that are not connected to an end portion of the coil conductor 2. The land electrodes 3a and 3b that are not connected to an end portion of the coil conductor are provided at the same locations as the land electrodes 3a and 3b provided on the adjacent insulator layer, respectively.

In FIG. 7, the coil conductors 2 provided on the first and the fourth insulator layers 5 laminated are connected to each other with the land electrodes 3a and the via conductor 4 penetrating the insulator layer 5, and form the primary coil 21A. Further, the coil conductors 2 provided on the second and the fifth insulator layers 5 laminated are connected to each other with the land electrodes 3a and the via conductor 4 penetrating the insulator layer 5, and form the secondary coil 22A. As described above, it is possible to configure the electronic component 1A as various electronic components such as a common mode choke coil, an inductor element, an LC composite component, or the like, by connecting the coil conductors 2 provided on respective layers.

In FIG. 7, the land electrode 3b on an end portion of the coil conductor 2 provided on the first insulator layer 5 laminated is connected to the lead-out conductor 6a provided on the third insulator layer 5 laminated, with the land electrodes 3b of the second insulator layer 5 laminated and the via conductor 4 interposed therebetween. The lead-out conductor 6a is electrically connected to the first electrode 11 in FIG. 1. Further, the land electrode 3b on an end portion of the coil conductor 2 provided on the fourth insulator layer 5 laminated is connected to the lead-out conductor 6c provided on the third insulator layer 5 laminated, with the via conductor 4 interposed therebetween. The lead-out conductor 6c is electrically connected to the third electrode 13 in FIG. 1. As described above, since both ends of the primary coil 21A are electrically connected to the first electrode 11 and the third electrode 13, respectively, it is possible to apply a voltage to the primary coil 21A by applying a voltage between the first electrode 11 and the third electrode 13.

In FIG. 7, the land electrode 3b on an end portion of the coil conductor 2 provided on the second insulator layer 5 laminated is connected to the lead-out conductor 6b provided on the third insulator layer 5 laminated, with the via conductor 4 interposed therebetween. The lead-out conductor 6b is electrically connected to the second electrode 12 in FIG. 1. Further, the land electrode 3b on an end portion of the coil conductor 2 provided on the fifth insulator layer 5 laminated is connected to the lead-out conductor 6d provided on the third insulator layer 5 laminated, with the land electrode 3b of the fourth insulator layer 5 laminated and the via conductor 4 interposed therebetween. The lead-out conductor 6d is electrically connected to the fourth electrode 14 in FIG. 1. As described above, since both ends of the secondary coil 22A are electrically connected to the second electrode 12 and the fourth electrode 14, respectively, it is possible to apply a voltage to the secondary coil 22A by applying a voltage between the second electrode 12 and the fourth electrode 14.

Figure 8:
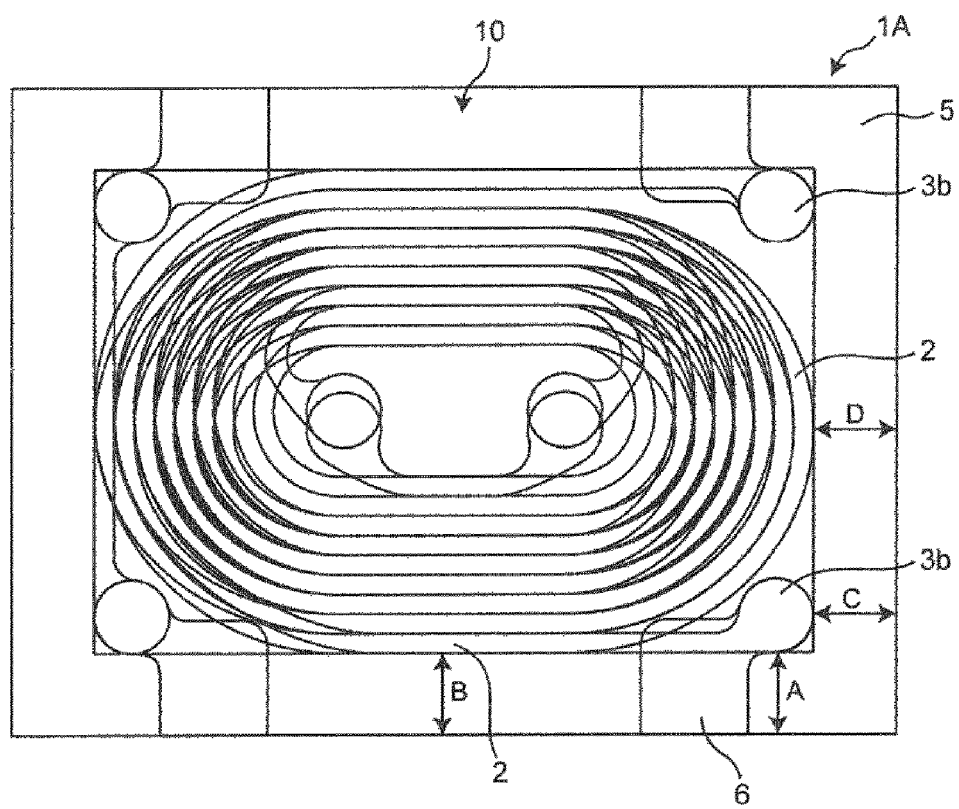
FIG. 8 is a perspective top view of the electronic component in FIG. 7.

FIG. 8 is a perspective top view of the electronic component 1A in FIG. 7. The electronic component 1A in FIG. 7 includes: the five insulator layers 5 the shape of which is substantially rectangular in plan view; the substantially spiral coil conductor 2 provided on the insulator layer 5; and the land electrode 3b located outside the coil conductor 2, facing two sides intersecting at a vertex of the substantially rectangular shape when viewed along a direction of laminating the insulator layers in the multilayer body 10, and electrically connected to an end portion of the coil conductor 2. Specifically, laminating the five insulator layers 5 on which the coil conductor 2 and the land electrode 3b are formed forms the multilayer body 10 in which the coil conductor 2 and the land electrode 3b are embedded between adjacent insulator layers 5.

In FIG. 8, the shortest distance A from the land electrode 3b to a long side of the multilayer body 10 is equal to the shortest distance B from the coil conductor 2 to the long side of the multilayer body 10. The electronic component 1A according to the present disclosure illustrated in FIG. 7 has such configuration, and thus in a process in which the multilayer body 10 is cut parallel to a long side direction thereof, in a case where the land electrode 3b is exposed on a cutting-section, the coil conductor 2 is always exposed as well. Accordingly, the land electrode 3b and the coil conductor 2 are exposed with enough sizes that may not be missed by an appearance sorter, in a defect piece on which the land electrode 3b is exposed due to variation in cutting accuracy, and thus it is possible to prevent the defect piece from passing the appearance sorter.

In FIG. 8, the shortest distance C from the land electrode 3b to a short side of the multilayer body 10 is equal to the shortest distance D from the coil conductor 2 to the short side of the multilayer body 10. The electronic component 1A according to the present disclosure illustrated in FIG. 7 has such configuration, and thus in a process in which the multilayer body 10 is cut parallel to a short side direction thereof, in a case where the land electrode 3b is exposed on a cutting-section, the coil conductor 2 is always exposed as well. Accordingly, the land electrode 3b and the coil conductor 2 are exposed as well with enough sizes that may not be missed by an appearance sorter, in a defect piece on which the land electrode 3b is exposed due to variation in cutting accuracy, and thus it is possible to prevent the defect piece from passing the appearance sorter.

In FIG. 8, the shortest distance A from the land electrode 3b to the long side of the multilayer body 10 is equal to the shortest distance B from the coil conductor 2 to the long side of the multilayer body 10, and the shortest distance C from the land electrode 3b to the short side of the multilayer body 10 is equal to the shortest distance D from the coil conductor 2 to the short side of the multilayer body 10. However, in the electronic component 1A according to the present disclosure, in a case where a shortest distance from one side of the two sides, that is, the long side and the short side, to the land electrode 3b is equal to or longer than a shortest distance from the coil conductor 2 to the one side, and where the land electrode 3b is exposed on a cutting-section in a cutting process parallel to the one side, the coil conductor 2 is always exposed as well. Accordingly, the land electrode 3b and the coil conductor 2 are exposed with enough sizes that may not be missed by an appearance sorter, in a defect piece on which the land electrode 3b is exposed due to variation in cutting accuracy, and thus it is possible to prevent the defect piece from passing the appearance sorter.

Figure 9:
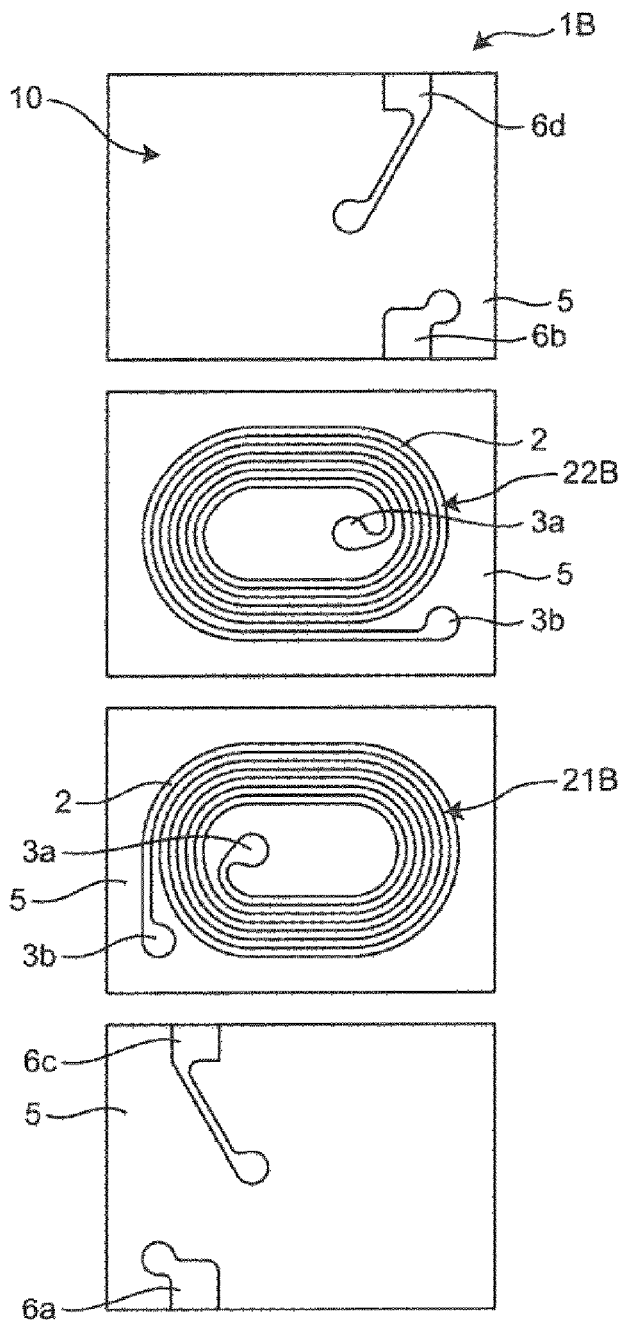
FIG. 9 is an exploded plan view of a multilayer body of an electronic component according to a third embodiment of the present disclosure.

FIG. 9 is an exploded plan view of an electronic component 1B according to a third embodiment of the present disclosure. The multilayer body 10 of the electronic component 1B in FIG. 9 includes, at least four insulator layers, and includes, in addition to the insulator layers 5 on which a lead-out conductor is not provided, the two insulator layers 5 on which the lead-out conductor is provided but the coil conductor 2 is not provided. In the third embodiment, a primary coil 21B and a secondary coil 22B are formed of the one coil conductor 2, respectively. The four insulator layers 5 illustrated in FIG. 9 are laminated in order from a bottom.

Of both end portions of the substantially spiral coil conductors 2 provided on the second and third insulator layers 5 laminated of the insulator layers 5 in FIG. 9, one end portion is connected to the land electrode 3a and the other end portion is connected to the land electrode 3b. In the third embodiment, the primary coil 21B is formed of the substantially spiral coil conductor 2 provided on the second insulator layer 5 laminated, and the secondary coil 22B is formed of the substantially spiral coil conductor 2 provided on the third insulator layer 5 laminated.

In FIG. 9, the land electrode 3b on an end portion of the coil conductor 2 provided on the second insulator layer 5 laminated is connected to the lead-out conductor 6a provided on the first insulator layer 5 laminated, with the via conductor 4 interposed therebetween. The lead-out conductor 6a is electrically connected to the first electrode 11 in FIG. 1. Further, the land electrode 3a on an end portion of the coil conductor 2 provided on the second insulator layer 5 laminated is connected to the lead-out conductor 6c provided on the first insulator layer 5 laminated, with the via conductor 4 interposed therebetween. The lead-out conductor 6c is electrically connected to the third electrode 13 in FIG. 1. As described above, since both ends of the primary coil 21B are electrically connected to the first electrode 11 and the third electrode 13, respectively, it is possible to apply a voltage to the primary coil 21B by applying a voltage between the first electrode 11 and the third electrode 13.

In FIG. 9, the land electrode 3b on an end portion of the coil conductor 2 provided on the third insulator layer 5 laminated is connected to the lead-out conductor 6b provided on the fourth insulator layer 5 laminated, with the via conductor 4 interposed therebetween. The lead-out conductor 6b is electrically connected to the second electrode 12 in FIG. 1. Further, the land electrode 3a on an end portion of the coil conductor 2 provided on the third insulator layer 5 laminated is connected to the lead-out conductor 6d provided on the fourth insulator layer 5 laminated, with the via conductor 4 interposed therebetween. The lead-out conductor 6d is electrically connected to the fourth electrode 14 in FIG. 1. As described above, since both ends of the secondary coil 22B are electrically connected to the second electrode 12 and the fourth electrode 14, respectively, it is possible to apply a voltage to the secondary coil 22B by applying a voltage between the second electrode 12 and the fourth electrode 14.

Figure 10:
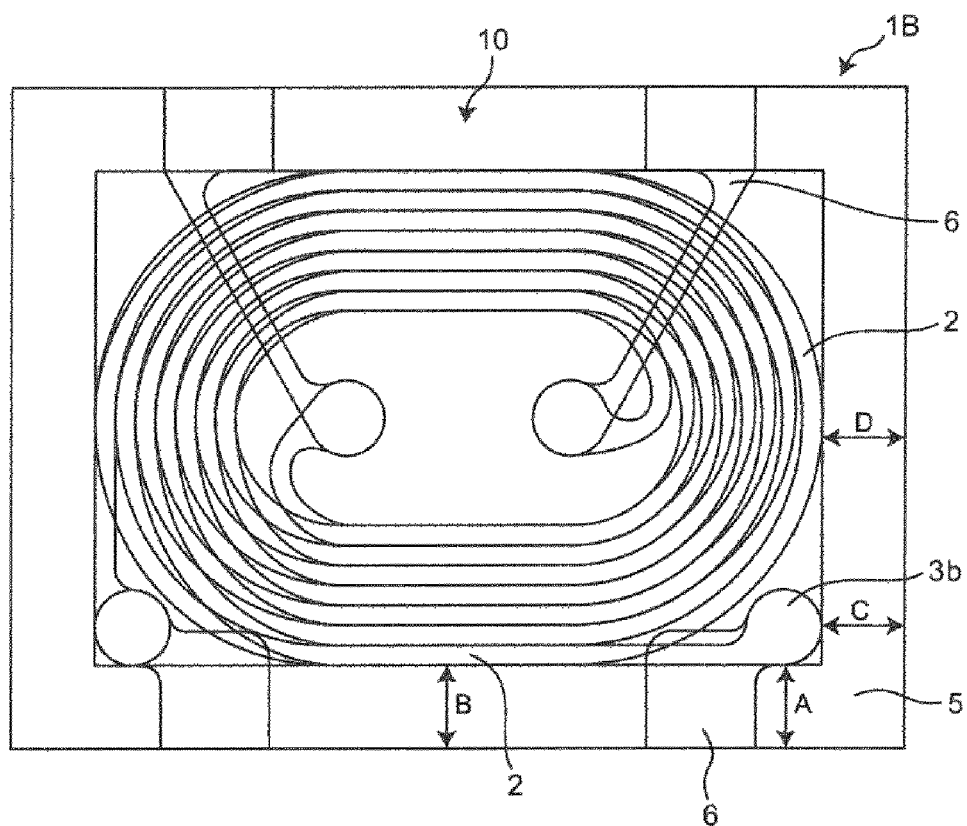
FIG. 10 is a perspective top view of the electronic component in FIG. 9.

FIG. 10 is a perspective top view of the electronic component 1B in FIG. 9. The electronic component 1B in FIG. 9 includes: the four insulator layers 5 the shape of which is substantially rectangular in plan view; the substantially spiral coil conductor 2 provided on the insulator layer 5; and the land electrode 3b located outside the coil conductor 2, facing two sides intersecting at a vertex of the substantially rectangular shape when viewed along a direction of laminating the insulator layers in the multilayer body 10, and electrically connected to an end portion of the coil conductor 2. Specifically, laminating the four insulator layers 5 on which the coil conductor 2 and the land electrode 3b are formed forms the multilayer body 10 in which the coil conductor 2 and the land electrode 3b are embedded between the adjacent insulator layers 5.

In FIG. 10, the shortest distance A from the land electrode 3b to the long side of the multilayer body 10 is equal to the shortest distance B from the coil conductor 2 to the long side of the multilayer body 10. The electronic component 1B according to the present disclosure illustrated in FIG. 9 has such configuration, and thus in a process in which the multilayer body 10 is cut parallel to a long side direction thereof, in a case where the land electrode 3b is exposed on a cutting-section, the coil conductor 2 is always exposed as well. Accordingly, the land electrode 3b and the coil conductor 2 are exposed with enough sizes that may not be missed by an appearance sorter, in a defect piece on which the land electrode 3b is exposed due to variation in cutting accuracy, and thus it is possible to prevent the defect piece from passing the appearance sorter.

In FIG. 10, the shortest distance C from the land electrode 3b to a short side of the multilayer body 10 is equal to the shortest distance D from the coil conductor 2 to the short side of the multilayer body 10. The electronic component 1B according to the present disclosure illustrated in FIG. 9 has such configuration, and thus in a process in which the multilayer body 10 is cut parallel to a short side direction thereof, in a case where the land electrode 3b is exposed on a cutting-section, the coil conductor 2 is always exposed as well. Accordingly, the land electrode 3b and the coil conductor 2 are exposed with enough sizes that may not be missed by an appearance sorter, in a defect piece on which the land electrode 3b is exposed due to variation in cutting accuracy, and thus it is possible to prevent the defect piece from passing the appearance sorter.

In FIG. 10, the shortest distance A from the land electrode 3b to the long side of the multilayer body 10 is equal to the shortest distance B from the coil conductor 2 to the long side of the multilayer body 10, and the shortest distance C from the land electrode 3b to the short side of the multilayer body 10 is equal to the shortest distance D from the coil conductor 2 to the short side of the multilayer body 10. However, in the electronic component 1B according to the present disclosure, in a case where a shortest distance from one side of the two sides, that is, the long side and the short side, to the land electrode 3b is equal to or longer than a shortest distance from the coil conductor 2 to the one side, and where the land electrode 3b is exposed on a cutting-section in a cutting process parallel to the one side, the coil conductor 2 is always exposed as well. Accordingly, the land electrode 3b and the coil conductor 2 are exposed with enough sizes that may not be missed by an appearance sorter, in a defect piece on which the land electrode 3b is exposed due to variation in cutting accuracy, and thus it is possible to prevent the defect piece from passing the appearance sorter.

An example of the electronic component according to the present disclosure will be described. The electronic component of the example may be manufactured as follows.

Examples

First, a plurality of green sheets containing alkali borosilicate glass is prepared. In this case, a green sheet having such a thickness that a thickness of an insulator layer of an electronic component is, for example, not less than about 7 µm and not more than about 35 µm (i.e., from about 7 µm to about 35 µm), preferably not less than about 14 µm and not more than about 28 µm (i.e., from about 14 µm to about 28 µm), is prepared. Here, the green sheet may be a composite material of alkali borosilicate glass and Ni—Cu—Zn ferrite. Next, a via hole is formed in the green sheet using a laser, or the like. After that, the via hole is filled with conductive paste to form a conductor that is configured as a via hole conductor. Next, conductors to be a coil conductor, a land electrode, and a lead-out conductor, respectively, are appropriately formed on the green sheet using a method such as screen printing. In this case, in the electronic component 1, as for a land electrode located outside an outermost circumference of the coil conductor, a conductor is formed in such a way that a shortest distance from the land electrode being outside the outermost circumference of the coil conductor to an end face of the multilayer body 10 is equal to or longer than a shortest distance from the outermost circumference of the coil conductor to the end face of the multilayer body 10, when seen through the multilayer body 10 from a top face. A line width of the coil conductor of the electronic component 1 is, for example, not less than about 7 µm and not more than about 35 µm (i.e., from about 7 µm to about 35 µm), preferably not less than about 10 µm and not more than about 24 µm (i.e., from about 10 µm to about 24 µm). Meanwhile, a spiral interval of a substantially spiral shape that the coil conductor has, is, for example, not less than about 7 µm and not more than about 35 µm (i.e., from about 7 µm to about 35 µm), preferably not less than about 10 µm and not more than about 24 µm (i.e., from about 10 µm to about 24 µm). The conductors are formed to satisfy the above-described conditions. The coil conductor and the lead-out conductors may be formed on the same insulator layer as illustrated in FIG. 1, or may be formed on different insulator layers as illustrated in FIG. 3 and FIG. 5. The conductive paste used in the screen printing contains an appropriate electrically conducting material. For example, an electrically conducting material mainly composed of Ag and containing an oxidized material such as $Al_2O_3$ and $SiO_2$ as an additive may be contained. After laminating the plurality of green sheets, an unbaked multilayer body is obtained by pressure bonding with a method such as isostatic press, and cutting the laminated green sheets. When laminating, the green sheet at the top of the multilayer body, and the green sheet at the bottom of the multilayer body, can be a green sheet composed of Ni—Cu—Zn ferrite, or the like. It is possible to manufacture the electronic component according to the present disclosure by baking the multilayer body, further applying an outer electrode on the chip-shaped multilayer body 10 and baking in order to form the outer electrode. Note that, it is possible to remove a burr by performing barrel processing for the multilayer body either before or after the baking. Further, the outer electrode preferably can be plated.

INDUSTRIAL APPLICABILITY

The electronic component according to the present disclosure may be used for various applications in a field of Electromagnetic Interference (EMI) measures. For example, the electronic component may be used as a common mode choke coil, an inductor element, or an LC composite component, and may be used for a smart phone, a personal computer, an audio instrument, a digital camera, or the like.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:
1. An electronic component comprising:
   a multilayer body obtained by laminating a plurality of insulator layers a shape of which is substantially rectangular in plan view;
   a coil conductor in a substantially spiral shape provided between adjacent insulator layers; and
   at least one land electrode located outside the coil conductor, facing two sides intersecting at a vertex of the substantially rectangular shape when viewed along a direction of laminating the insulator layers, and electrically connected to an end portion of the coil conductor, wherein
   a shortest distance from one side of the two sides to every portion of the land electrode is longer than a shortest distance from each winding layer of the coil conductor on the adjacent insulator layers to the one side, and
   a shortest distance from an other side of the two sides to the every portion of the land electrode is longer than a shortest distance from the each winding layer of the coil conductor on the adjacent insulator layers to the other side.

2. The electronic component according to claim 1, wherein
the at least one land electrode includes two land electrodes, one of which is located on one surface and an other of which is located on an other surface of at least one insulator layer, and the electronic component further includes a via conductor that penetrates the at least one insulator layer and connects the two land electrodes to each other, the via conductor is located outside the coil conductor and facing the two sides when viewed along the direction of laminating the insulator layers, and a shortest distance from the one side to the via conductor is longer than a shortest distance from the coil conductor to the one side.

3. The electronic component according to claim 2, wherein
a shortest distance from an other side of the two sides to the via conductor is longer than a shortest distance from the coil conductor to the other side.

4. The electronic component according to claim 2, wherein
an area of a surface of the land electrode facing the via conductor is smaller than an area of a surface of the via conductor facing the land electrode, and the land electrode is located inside the surface of the via conductor facing the land electrode when viewed along the direction of laminating the insulator layers.

5. The electronic component according to claim 2, wherein
a shortest interval between the via conductor and the coil conductor is longer than a spiral interval of the coil conductor.

6. The electronic component according to claim 1, wherein
a shortest interval between the coil conductor and the land electrode is longer than the spiral interval of the coil conductor.

7. The electronic component according to claim 1, wherein
a connection width of a portion at which the coil conductor and the land electrode are connected is wider than a width of a portion of the coil conductor, the portion forming a substantially spiral shape of the coil conductor.

8. The electronic component according to claim 1, wherein
the plurality of the insulator layers are substantially rectangular shapes each having a long side and a short side, and the coil conductor includes a linear portion parallel to at least one of the long side and the short side.

9. The electronic component according to claim 1, wherein
the plurality of the insulator layers are substantially rectangular shapes each having a long side and a short side, and a portion of the coil conductor facing a short side of the multilayer body has a substantially semi-circular shape.

10. The electronic component according to claim 1, wherein
the coil conductor includes coil conductors to form a primary coil and coil conductors to form a secondary coil, the multilayer body includes eight insulator layers, the coil conductor and the at least one land electrode are provided on the insulator layers, such that those of the coil conductors provided on first, third, fourth, and seventh laminated layers form the primary coil, and those of the coil conductors provided on second, fifth, sixth, and eighth laminated layers form the secondary coil, and the at least one land electrode includes a plurality of land electrodes, with a respective one of the land electrodes being provided on a respective one of each of the first through eighth laminated layers.

11. The electronic component according to claim 1, wherein
the coil conductor includes coil conductors to form a primary coil and coil conductors to form a secondary coil, the multilayer body includes eight insulator layers, the coil conductor and the at least one land electrode are provided on the insulator layers, such that those of the coil conductors provided on first, third, fifth, and seventh laminated layers form the primary coil, and those of the coil conductors provided on second, fourth, sixth, and eighth laminated layers form the secondary coil, and the at least one land electrode includes a plurality of land electrodes, with a respective one of the land electrodes being provided on a respective one of each of the first through eighth laminated layers.

12. The electronic component according to claim 1, wherein
the coil conductor includes coil conductors to form a primary coil and coil conductors to form a secondary coil, the multilayer body includes eight insulator layers, the coil conductor and the at least one land electrode are provided on the insulator layers, such that those of the coil conductors provided on first, fourth, fifth, and eighth laminated layers form the primary coil, and those of the coil conductors provided on second, third, sixth, and seventh laminated layers form the secondary coil, and the at least one land electrode includes a plurality of land electrodes, with a respective one of the land electrodes being provided on a respective one of each of the first through eighth laminated layers.

13. The electronic component according to claim 1, wherein
the at least one land electrode includes two land electrodes, one of which is provided at a corner and the other of which is provided at another corner diagonally of the substantially rectangular shape.

14. The electronic component according to claim 3, wherein
an area of a surface of the land electrode facing the via conductor is smaller than an area of a surface of the via conductor facing the land electrode, and the land electrode is located inside the surface of the via conductor facing the land electrode when viewed along the direction of laminating the insulator layers.

15. The electronic component according to claim 3, wherein
a shortest interval between the via conductor and the coil conductor is longer than a spiral interval of the coil conductor.

16. The electronic component according to claim 2, wherein
a shortest interval between the coil conductor and the land electrode is longer than the spiral interval of the coil conductor.

17. The electronic component according to claim 2, wherein
a connection width of a portion at which the coil conductor and the land electrode are connected is wider than a width of a portion of the coil conductor, the portion forming a substantially spiral shape of the coil conductor.

18. The electronic component according to claim 2, wherein
the plurality of the insulator layers are substantially rectangular shapes each having a long side and a short side, and the coil conductor includes a linear portion parallel to at least one of the long side and the short side.

19. An electronic component comprising:
a multilayer body obtained by laminating a plurality of insulator layers a shape of which is substantially rectangular in plan view;
a coil conductor in a substantially spiral shape provided between adjacent insulator layers; and
at least one land electrode located outside the coil conductor, facing two sides intersecting at a vertex of the substantially rectangular shape when viewed along a direction of laminating the insulator layers, and electrically connected to an end portion of the coil conductor, wherein
a shortest distance from one side of the two sides to the land electrode is longer than a shortest distance from the coil conductor to the one side,
the at least one land electrode includes two land electrodes, one of which is located on one surface and an other of which is located on an other surface of at least one insulator layer, and the electronic component further includes a via conductor that penetrates the at least one insulator layer and connects the two land electrodes to each other, the via conductor is located outside the coil conductor and facing the two sides when viewed along the direction of laminating the insulator layers, and a shortest distance from the one side to the via conductor is longer than a shortest distance from the coil conductor to the one side, and
an area of a surface of the land electrode facing the via conductor is smaller than an area of a surface of the via conductor facing the land electrode, and the land electrode is located inside the surface of the via conductor facing the land electrode when viewed along the direction of laminating the insulator layers.

\* \* \* \* \*